United States Patent [19]

Rubin et al.

[11] Patent Number: 4,685,852
[45] Date of Patent: Aug. 11, 1987

[54] PROCESS APPARATUS AND METHOD AND ELEVATOR MECHANISM FOR USE IN CONNECTION THEREWITH

[75] Inventors: Richard H. Rubin, West Paterson; Gary Hillman, Livingston; Lewis E. Zarr, Sparta; William K. Hayes, Parsippany, all of N.J.

[73] Assignee: Machine Technology, Inc., Parsippany, N.J.

[21] Appl. No.: 735,863

[22] Filed: May 20, 1985

[51] Int. Cl.⁴ ............................................. B65G 65/36
[52] U.S. Cl. ..................................... 414/404; 414/786; 414/416; 414/417; 414/217; 414/752; 414/225; 414/331; 414/280; 414/744 B; 414/609; 118/500; 118/729; 221/278; 221/211
[58] Field of Search ................... 414/752, 744 B, 403, 414/404, 331, 416, 417, 280, 277, 610, 609, 612, 217, 218, 219, 220, 221, 222, 223, 224, 225, 226; 118/728, 729, 500; 221/211, 278

[56] References Cited

U.S. PATENT DOCUMENTS

| | | | |
|---|---|---|---|
| 3,047,933 | 8/1962 | Chick et al. ........................ | 204/198 X |
| 3,530,571 | 9/1970 | Perry ................................. | 228/3.1 X |
| 3,543,392 | 12/1970 | Perry et al. ........................ | 29/563 |
| 3,557,976 | 1/1971 | Isobe ................................ | 414/331 |
| 3,576,540 | 4/1971 | Fair et al. ......................... | 29/568 X |
| 3,618,199 | 11/1971 | King et al. ........................ | 29/707 X |
| 3,823,836 | 7/1974 | Cheney et al. ..................... | 414/225 |
| 3,889,355 | 6/1975 | Aronstein et al. ................. | 29/563 X |
| 3,902,615 | 9/1975 | Levy et al. ........................ | 414/331 |
| 3,946,484 | 3/1976 | Aronstein et al. ................. | 29/563 X |
| 4,062,463 | 12/1977 | Hillman et al. .................... | 414/225 |
| 4,141,458 | 2/1979 | Brooks et al. ..................... | 414/331 |
| 4,147,432 | 4/1979 | Yamawaki et al. ................ | 118/729 X |
| 4,208,159 | 6/1980 | Uehara et al. .................... | 414/404 X |
| 4,381,965 | 5/1983 | Maher, Jr. et al. ............... | 414/417 X |
| 4,465,416 | 8/1984 | Burkhalter et al. ............... | 414/217 X |
| 4,550,239 | 10/1985 | Uehara et al. .................... | 414/331 X |

FOREIGN PATENT DOCUMENTS 28274  3/1977  Japan ................................. 118/729

Primary Examiner—Frank E. Werner
Attorney, Agent, or Firm—Lerner, David, Littenberg, Krumholz & Mentlik

[57] ABSTRACT

Methods and apparatus for transferring workpieces, such as silicon wafers, between a pair of cassettes involve simultaneously and conjointly indexing the cassettes such that the cassettes are incrementally lowered as the individual workpieces are removed from one cassette and delivered to the other cassette. Such indexing of the cassettes is achieved by a single elevator mechanism adapted to support both of the cassettes such that they are vertically and horizontally offset relative to each other.

30 Claims, 3 Drawing Figures

PROCESS APPARATUS AND METHOD AND ELEVATOR MECHANISM FOR USE IN CONNECTION THEREWITH

FIELD OF THE INVENTION

The present invention relates to methods and apparatus for transferring workpieces from one cassette to another cassette, and, more particularly, to such methods and apparatus which are especially useful in connection with processing methods and apparatus, such as those used to make semiconductor devices from silicon wafers.

BACKGROUND OF THE INVENTION

U.S. Pat. No. 4,062,463 discloses a unique transport system which employs a single cassette from which workpieces, such as silicon wafers, are transferred to a processing station and, after processing, are returned to the same cassette. Such a system eliminates the need for two separate cassettes, and, hence, it also eliminates the necessity of providing a rather complex mechanism for coordinating the movement of the cassettes such that one is positioned to transfer the workpieces to the processing station while the other is positioned to receive the workpieces after they have been processed. Because it employs a single cassette and a relatively simple transfer mechanism, the system of the '463 patent can be made rather compact. Despite its advantages, the system disclosed in the '463 patent does suffer from one drawback. Namely, such a system can only process one workpiece at a time.

The systems which employ two cassettes, one for delivering workpieces to a processing station and the other for receiving the processed workpieces from the processing station, are advantageous in that they can be more readily adapted to process a plurality of workpieces simultaneously. This advantage has, as indicated above, been offset by the need for rather complex mechanisms to coordinate the movement of the two cassettes. Typically, such a mechanism would require two separate elevators, one for each cassette.

SUMMARY OF THE INVENTION

The present invention is useful in transferring workpieces from a first cassette to a second cassette, each cassette being adapted to store workpieces one above the other. In accordance with the present invention, after unloading a first workpiece from the first cassette, the cassettes are simultaneously and conjointly indexed such that the first cassette is in a position in which a second workpiece can be unloaded therefrom and such that the second cassette is in a position in which the first workpiece can be loaded thereinto. After unloading the second workpiece from the first cassette and loading the first workpiece into the second cassette, the cassettes are once again simultaneously and conjointly indexed such that the second cassette is in a position in which the second workpiece can be loaded thereinto. If there are additional workpieces in the first cassette, the foregoing procedure would be repeated until all of the workpieces in the first cassette have been unloaded therefrom and loaded into the second cassette.

Because the cassettes are indexed simultaneously and conjointly, they can be raised and lowered by a single elevator mechanism, which can therefore be less complex than the double elevators employed by the prior art devices. When employed in connection with a processing operation (i.e., when the workpieces are processed as they are being transferred between the cassettes), the present invention makes it possible to simultaneously process a plurality of workpieces. By maintaining the second cassette a constant predetermined distance above the first cassette as the first and second cassettes are indexed (such predetermined distance being equal to the spacing between adjacent workpieces stored in the first and second cassettes), the workpieces can be transferred from slots in the first cassette to corresponding slots in the second cassette.

In one exemplary embodiment of the present invention, the workpieces are unloaded from the first cassette by a first transfer arm movable through the first cassette between a retracted position and an extended position, while the workpieces are loaded into the second cassette by a second transfer arm movable through the second cassette between a retracted position and an extended position. In this embodiment, the first transfer arm, in its retracted position, is positioned underneath the workpieces contained in the first cassette and the second transfer arm, in its retracted position, is positioned clear of the workpieces contained in the second cassette. Such positioning of the transfer arms relative to the cassettes can be accomplished by horizontally offsetting the first cassette relative to the second cassette.

BRIEF DESCRIPTION OF THE DRAWINGS

For a better understanding of the present invention, reference is made to the following description of an exemplary embodiment of the invention considered in conjunction with the accompanying drawings, in which.

DESCRIPTION OF THE EXEMPLARY EMBODIMENT

Although the present invention is applicable to many different types of apparatus which require workpieces to be transferred from one cassette to another cassette, it is especially suitable for use in connection with processing apparatus, such as those used to make semiconductor devices from silicon wafers, designed to simultaneously process a plurality of workpieces as they are being transferred between two cassettes. Accordingly, the present invention will be described in connection with a semiconductor manufacturing apparatus.

Figure 1:
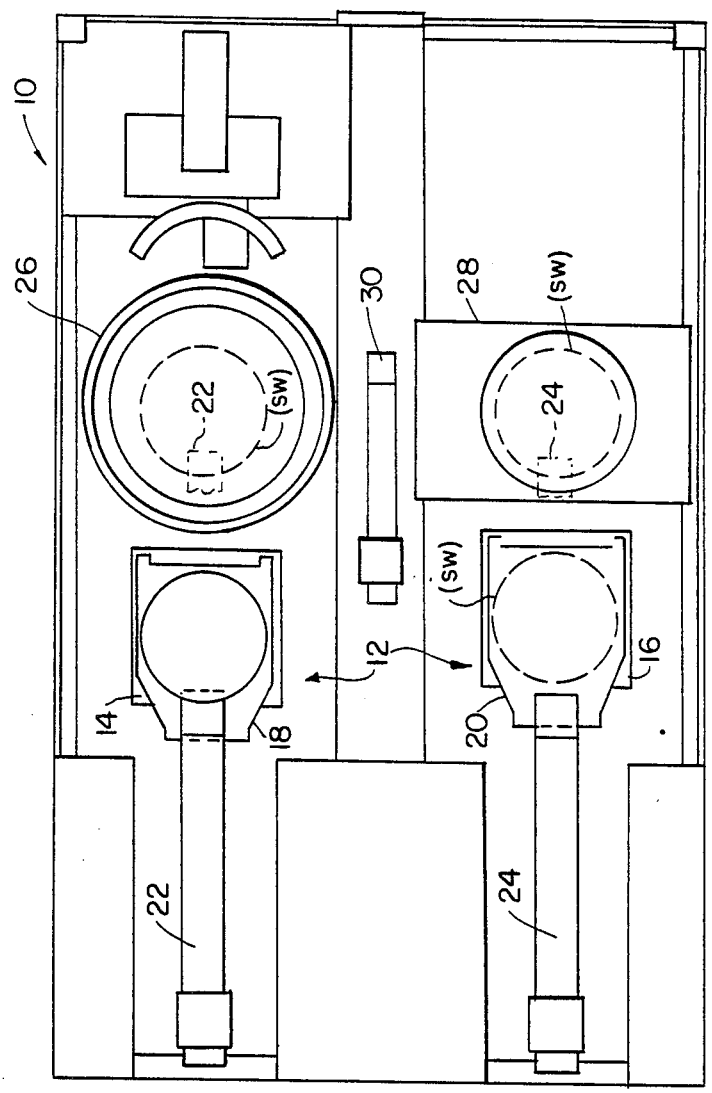
FIG. 1 is a schematic plan view of a semiconductor manufacturing apparatus incorporating one embodiment of an elevator assembly constructed in accordance with the present invention.

With reference to FIG. 1, a semiconductor manufacturing apparatus 10 is provided with an elevator assembly 12, which includes platforms 14, 16 adapted to support cassettes 18, 20, respectively. Silicon wafers (sw) are arranged one above the other in the cassette 18. The silicon wafers (sw) are unloaded from the cassette 18 by a transfer arm 22, while a transfer arm 24 is provided so as to load the silicon wafers (sw) into the cassette 20. In addition to unloading the silicon wafers (sw) from the cassette 18, the transfer arm 22 also delivers the silicon wafers (sw) to a coating station 26. The transfer arm 24, in addition to loading the silicon wafers (sw) into the cassette 20, also removes the silicon wafers (sw) from a baking station 28 arranged alongside the coating station 26. The silicon wafers (sw) are transferred from the coating station 26 to the baking station 28 by a pivotable transfer arm 30.

Except for the elevator assembly 12, all of the components of the semiconductor manufacturing apparatus 10 are conventional (see, for instance, U.S. Pat. No. 4,062,463). Accordingly, a detailed description of the elevator assembly 12 only is set forth below, followed by a description of the basic operation of the semiconductor manufacturing apparatus 10.

Figure 2:
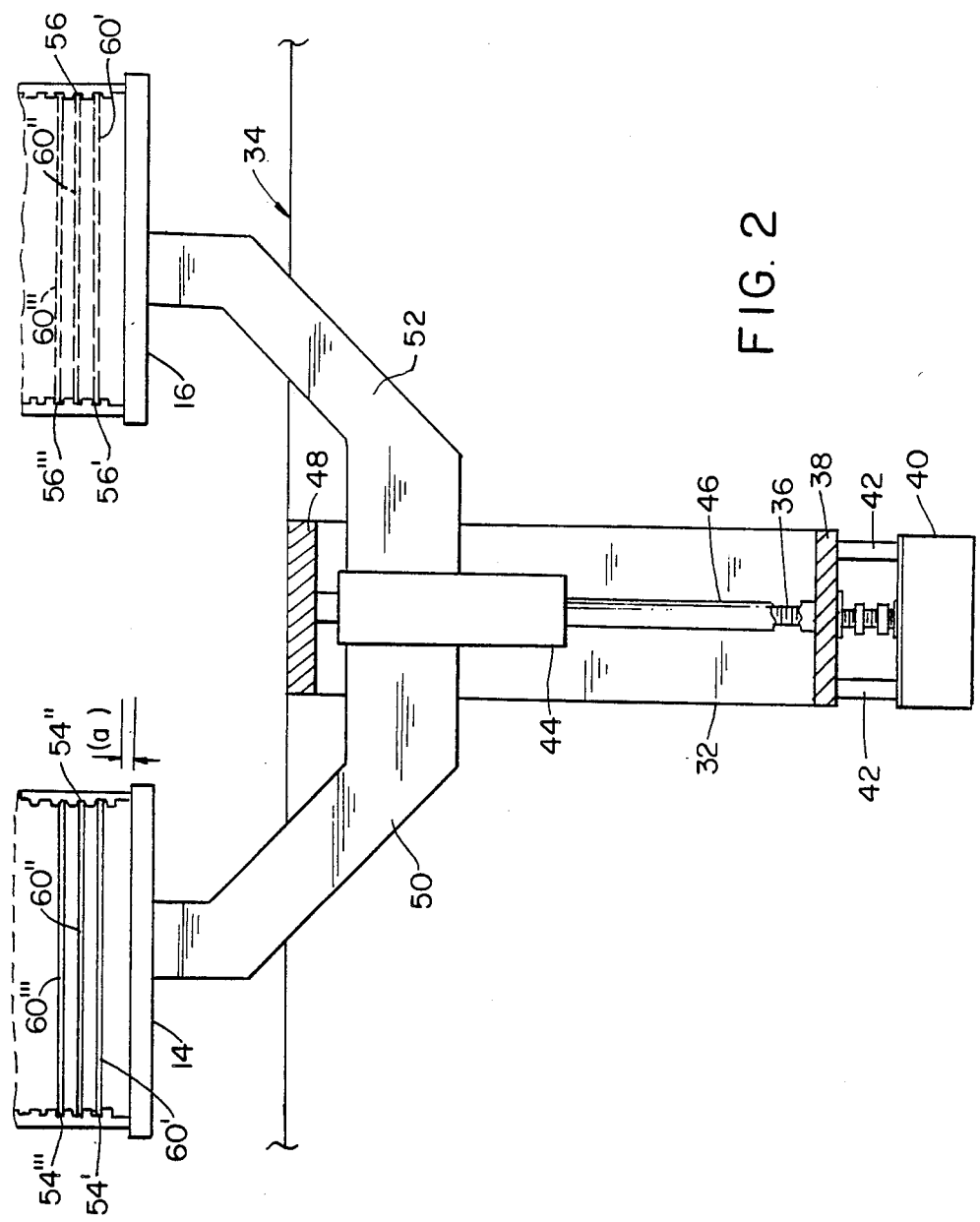
FIG. 2 is a detailed front elevational view of the elevator assembly illustrated in FIG. 1, a portion of the elevator assembly being broken away to facilitate consideration and discussion.
Figure 3:
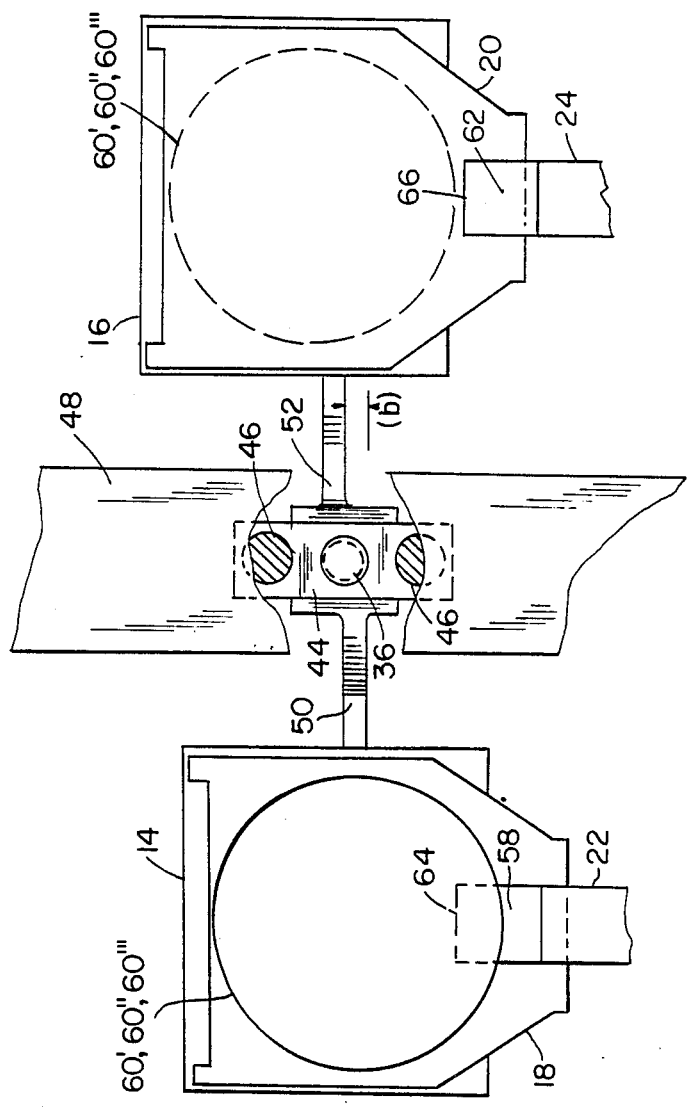
FIG. 3 is a detailed plan view of the elevator assembly illustrated in FIG. 2, a portion of the elevator assembly being broken away to facilitate consideration and discussion.

Referring now to FIGS. 2 and 3, the elevator assembly 12 is mounted on an I-beam assembly 32 which forms a part of a chassis 34 of the semiconductor manufacturing apparatus 10. A rotatable lead screw 36 extends upwardly through a lower member 38 of the I-beam assembly 32. The lead screw 36 is rotated by a motor 40 attached to the lower member 38 of the I-beam assembly 32 by standoffs 42. A slide block 44 is threadedly mounted on the lead screw 36 such that the slide block 44 moves up and down on the lead screw 36 in response to the rotation of the lead screw 36. Slide rods 46, which extend between the bottom member 38 of the I-beam assembly 32 and a top member 48 of the I-beam assembly 32, guide the slide block 44 as it moves up and down on the lead screw 36.

Brackets 50, 52 extend upwardly and outwardly from the slide block 44. The brackets 50, 52 support the platforms 14, 16, respectively, such that the platforms 14, 16 are arranged side-by-side and move up and down simultaneously and conjointly with the slide block 44. The platforms 14, 16 support, in turn, the cassettes 18, 20, respectively, which also move up and down simultaneously and conjointly with the slide block 44.

With reference to FIG. 2, the brackets 50, 52 support the platforms 14, 16 such that the platform 16 is maintained a constant predetermined distance (a) above the platform 14, whereby the cassette 20 is constantly maintained above the cassette 18 by the distance (a). The distance (a) is equal to the pitch of the cassettes 18, 20 (i.e., the distance between slots 54', 54'', 54''' of the cassette 18 and the slots 56', 56'', 56''' of the cassette 20). The significance of such vertical offsetting of the platforms 14, 16 and, hence, the cassettes 18, 20 will be discussed hereinafter in connection with the description of the operation of the semiconductor manufacturing apparatus 10.

Referring now to FIG. 3, the brackets 50, 52 also support the platforms 14, 16 such that the platforms 14, 16 are horizontally offset relative to each other by a distance (b). The distance (b) is selected such that the transfer arm 22, in its retracted position, is positioned so as to locate a suction tip 58 directly beneath silicon wafers 60', 60'', 60''' (shown in solid lines) stored in the slots 54', 54'', 54''', respectively, of the cassette 18, while the transfer arm 24, in its retracted position, is positioned so as to locate a suction tip 62 clear of the silicon wafers 60,' 60'', 60''' (shown in phantom) stored in the slots 56', 56'', 56''', respectively, of the cassette 20 after the transfer of the silicon wafers 60', 60'', 60''' from the cassette 18 to the cassette 20. The purpose of such horizontal offsetting of the cassettes 18, 20 will be explained hereinafter in connection with the description of the operation of the semiconductor manufacturing apparatus 10. Before discussing the operation of the semiconductor manufacturing apparatus 10, it should be understood that the suction tips 58, 62 are situated directly across from each other when the transfer arms 22, 24 are in their retracted positions (i.e., in the retracted positions of the transfer arms 22, 24, ends 64, 66 of the suction tips 58, 62, respectively, lie in a common vertical plane).

In operation, the elevator assembly 12 is situated in a home position (see FIG. 2) in which the silicon wafer 60' (i.e., the lowest one stored in the cassette 18) is located just above the transfer arm 22. When the elevator assembly 12 is in its home position, the cassette 20 is in a position in which the transfer arm 24 is positioned below the slot 56' by the distance (a), whereby the transfer arm 24 cannot load the cassette 20.

As the silicon wafer 60' is held on the transfer arm 22 by suction emanating from the suction tip 58, the transfer arm 22 is moved from its retracted position through the cassette 18 to an extended position (illustrated in phantom in FIG. 1) in which the transfer arm 22 overlies the coating station 26. After the silicon wafer 60' is transferred from the transfer arm 22 to the coating station 26 in a conventional manner (see, for instance, U.S. Pat. No. 4,062,463), the transfer arm 22 is returned to its retracted position.

After the completion of a coating operation on the silicon wafer 60', the silicon wafer 60' is transferred from the coating station 26 to the baking station 28 by the transfer arm 30, which operates in a manner similar to the transfer arm 22. When the silicon wafer 60' has been transferred to the baking station 28, the elevator assembly 12 is indexed (i.e., incrementally lowered) a distance equal to the pitch of the cassettes 18, 20, whereby the cassette 18 is in a position in which the silicon wafer 60'' (i.e., the second lowest one in the cassette 18) is positioned directly above the suction tip 58 of the transfer arm 22 and the cassette 20 is in a position in which the slot 56' is arranged so as to be loaded by the transfer arm 24.

With the silicon wafer 60'' held on the transfer arm 22 by suction emanating from the suction tip 58, the transfer arm 22 is moved again from its retracted position through the cassette 18 to its extended position. After transferring the silicon wafer 60'' from the transfer arm 22 to the coating station 26, the transfer arm 22 is returned to its retracted position.

Upon the completion of a baking operation on the silicon wafer 60', the transfer arm 24 is moved from its retracted position through the cassette 20 to an extended position (illustrated in phantom in FIG. 1) in which the transfer arm 24 overlies the baking station 28. After the silicon wafer 60' is transferred from the baking station 28 to the transfer arm 24 in a conventional manner (see, for instance, U.S. Pat. No. 4,062,463), the transfer arm 24 is returned to its retracted position. As the transfer arm 24 returns to its retracted position, the silicon wafer 60' is held on the transfer arm 24 by suction emanating from the suction tip 62. Just before the transfer arm 24 reaches its retracted position, the suction emanating from the suction tip 62 is terminated, thereby depositing the silicon wafer 60' in the slot 56' of the cassette 20 without the aid of stop pins or the like.

After completion of a coating operation on the silicon wafer 60'' the silicon wafer 60'' is transferred from the coating station 26 to the baking station 28 by the transfer arm 30. When the silicon wafer 60'' has been transferred to the baking station 28, the elevator assembly 12 is indexed again a distance equal to the pitch of the cassettes 18, 20, whereby the cassette 18 is in a position in which the silicon wafer 60''' (i.e., the third lowest one in the cassette 18) is positioned directly above the suction tip 58 of the transfer arm 22 and the cassette 20 is in a position in which the slot 56'' is arranged so as to be loaded by the transfer arm 24. Because the transfer arm 24, in its retracted position, is clear of the silicon wafer 60', the transfer arm 24 does not interfere with the indexing of the elevator assembly.

With the silicon wafer 60''' held on the transfer arm 22 by suction emanating from the suction tip 58, the transfer arm 22 is once again moved from its retracted position through the cassette 18 to its extended position. After transferring the silicon wafer 60''' from the transfer arm 22 to the coating station 26, the transfer arm 22 is returned to its retracted position.

Upon the completion of a baking operation on the silicon wafer 60'', the transfer arm 24 is moved from its retracted position through the cassette 20 to its extended position over the baking station 28. After the silicon wafer 60'' is transferred from the baking station 28 to the transfer arm 24, the transfer arm 24 is returned to its retracted position. Just before the transfer arm 24 reaches its retracted position, the suction emanating from the suction tip 62 is terminated, thereby depositing the silicon wafter 60'' in the slot 56'' directly above the silicon wafer 60'.

After the completion of a coating operation on the silicon wafer 60''', the silicon wafer 60''' is transferred from the coating station 26 to the baking station 28 by the transfer arm 30. When the silicon wafer 60''' has been transferred to the baking station 28, the elevator assembly 12 is once again indexed a distance equal to the pitch of the cassettes 18, 20, whereby the cassette 20 is in a position in which the slot 56''' is arranged so as to be loaded by the transfer arm 24.

Upon the completion of a baking operation on the silicon wafer 60''', the transfer arm 24 is moved from its retracted position through the cassette 20 to its extended position over the baking station 28. After the silicon wafer 60''' is transferred from the baking station 28 to the transfer arm 24, the transfer arm 24 is returned to its retracted position. Just before the transfer arm 24 reaches its retracted position, the suction emanating from the suction tip 62 is terminated, thereby depositing the silicon wafer 60''' in the slot 56''' directly above the silicon wafers 60', 60''.

By the foregoing procedure, the silicon wafers 60', 60'', 60''' are transferred from the slots 54', 54'', 54''', respectively, of the cassette 18 to the corresponding slots 56', 56'', 56''', respectively, of the cassette 20. If the cassette 18 contains more than three wafers (twenty-five being the typical number), the foregoing steps would be repeated until all of the silicon wafers have been transferred from the cassette 18 to the cassette 20. If the cassettes 18, 20 were not vertically offset, it would be impossible, using the elevator assembly 12 and the transfer arms 22, 24, to transfer all of the silicon wafers from the cassette 18 (assuming it is fully loaded) to the cassette 20 for the reason that the silicon wafers would not be transferred between corresponding slots of the cassettes 18, 20 (i.e., the silicon wafer 60' would be removed from the slot 54' of the cassette 18 and delivered to the slot 56'', rather than the slot 56', of the cassette 20).

It will be understood that the embodiment described herein is merely exemplary and that a person skilled in the art may make many variations and modifications without departing from the spirit and scope of the invention. All such variations and modifications are intended to be included in the scope of the invention as defined in the appended claims.

We claim:

1. A method of transferring workpieces from a first cassette to a second cassette, said first and second cassettes being adapted to store workpieces one above the other, said method comprising the steps of:
   (a) unloading a first workpiece from said first cassette by a first transfer arm movable between a retracted position and an extended position, maintaining said first transfer arm positioned underneath said workpieces in said first cassette for engagement therewith when said first transfer arm is in said retracted position and upon indexing said first cassette;
   (b) simultaneously and conjointly indexing said first and second cassettes in a common direction such that said first cassette is in a position in which a second workpiece can be unloaded therefrom and such that said second cassette is in a position in which said first workpiece can be loaded thereinto;
   (c) unloading said second workpiece from said first cassette by operation of said first transfer arm;
   (d) intermediately supporting and transferring unloaded workpieces between said first transfer arm and a second transfer arm;
   (e) loading said first workpiece into said second cassette by said second transfer arm which is movable between a retracted position and an extended position, maintaining said second transfer arm positioned clear of said workpieces in said second cassette when said second transfer arm is in said retracted position and upon indexing said second cassette; and
   (f) simultaneously and conjointly indexing said first and second cassettes in said common direction such that said second cassette is in a position in which said second workpiece can be loaded thereinto.

2. The method of claim 1, wherein steps (a)–(e) are repeated on successive workpieces stored in said first cassette until all of said workpieces in said first cassette have been unloaded therefrom and loaded into said second cassette.

3. The method of claim 1, further comprising the step of performing a processing operation on each workpiece during its transfer from said first cassette to said second cassette.

4. The method of claim 1, wherein said first workpiece is the lowest workpiece in said first cassette and wherein said second workpiece is the second lowest workpiece in said first cassette.

5. The method of claim 4, wherein said first workpiece is the lowest workpiece in said second cassette and wherein said second workpiece is the second lowest workpiece in said second cassette.

6. The method of claim 5, wherein said first and second cassettes have the same pitch.

7. The method of claim 6, wherein said second cassette is maintained a constant predetermined distance above said first cassette as said first and second cassettes are indexed, said predetermined distance being equal to said pitch of said first and second cassettes.

8. The method of claim 7, wherein said first and second cassettes are indexed by incrementally lowering them.

9. The method of claim 8, wherein said first and second cassettes are arranged side-by-side.

10. The method of claim 9, wherein said first transfer arm is arranged at a first elevation and wherein said second transfer arm is arranged at a second elevation which is the same as said first elevation.

11. The method of claim 10, wherein said retracted position of said first transfer arm is laterally across from said retracted position of said second transfer arm.

12. The method of claim 1, wherein said second cassette is in a position in which no workpieces can be loaded thereinto when said first cassette is in said position in which said first workpiece can be unloaded therefrom and wherein said first cassette is in a position in which a third workpiece can be unloaded therefrom when said second cassette is in a position in which said second workpiece can be loaded thereinto.

13. The method of claim 1, wherein said workpieces are silicon wafers from which semiconductor devices are made.

14. Apparatus for transferring workpieces from a first cassette to a second cassette, said first and second cassettes being adapted to store workpieces one above the other, said apparatus comprising unloading means movable between a retracted position and an extended position for successively unloading workpieces from said first cassette, loading means movable between a retracted position and an extended position for successively loading said workpieces into said second cassette, means for intermediately supporting and transferring unloading workpieces between said unloading means and said loading means, and indexing means for simultaneously and conjointly indexing said first and second cassettes in a common direction such that, after said unloading means has unloaded a first workpiece from said first cassette, said first cassette is indexed to a position in which a second workpiece can be unloaded therefrom and said second cassette is indexed to a position in which said first workpiece can be loaded thereinto, said indexing means including a first platform supporting said first cassette and a second platform supporting said second cassette, said first cassette horizontally offset relative to said second cassette, wherein said unloading means when in its said retracted position is positioned underneath said workpieces in said first cassette, and said loading means when in its said retracted position is positioned clear of said workpieces in said second cassette, whereby said unloading means when in its said retracted position engages one of said workpieces in said first cassette upon indexing thereof, and said loading means when in its said retracted position is clear of said workpieces in said second cassette upon indexing thereof.

15. The apparatus of claim 14, further comprising performing means for preforming a processing operation on each workpiece during its transfer from said first cassette to said second cassette.

16. The apparatus of claim 14, wherein said first workpiece is the lowest workpiece in said first cassette and wherein said second workpiece is the second lowest workpiece in said first cassette.

17. The apparatus of claim 16, wherein said first workpiece is the lowest workpiece in said second cassette and wherein said second workpiece is the second lowest workpiece in said second cassette.

18. The apparatus of claim 17, wherein said first and second cassettes have the same pitch.

19. The apparatus of claim 18, wherein said second platform is maintained a constant predetermined distance above said first platform as said first and second cassettes are indexed, said predetermined distance being equal to said pitch of said first and second cassettes.

20. The apparatus of claim 19, wherein said indexing means indexes said first and second cassettes by incrementally lowering them.

21. The apparatus of claim 20, wherein said unloading means includes a first transfer arm movable through said first cassette between said retracted position and said extended position and wherein said loading means includes a second transfer arm movable through said second cassette between said retracted position and said extended position.

22. The apparatus of claim 21, wherein said first and second platforms are arranged side-by-side, whereby said first and second cassettes are arranged side-by-side.

23. The apparatus of claim 22, wherein said first transfer arm is arranged at a first elevation and wherein said second transfer arm is arranged at a second elevation which is the same as said first elevation.

24. The apparatus of claim 23, wherein said retracted position of said first transfer arm is laterally across from said retracted position of said second transfer arm.

25. The apparatus of claim 14, wherein said indexing means indexes said first and second cassettes such that said second cassette is in a position in which no workpieces can be loaded thereinto when said first cassette is in said position in which said first workpiece can be unloaded therefrom and such that said first cassette is in a position in which a third workpiece can be unloaded therefrom when said second cassette is in a position in which said second workpiece can be loaded thereinto.

26. The apparatus of claim 25, wherein said first and second platforms are raised and lowered by a common elevator means.

27. The apparatus of claim 26, wherein said elevator means includes a rotatable lead screw and a carriage threadedly mounted on said lead screw such that said carriage reciprocates up and down on said lead screw in response to its rotation, said carriage being fixedly attached to said first and second platforms such that said first and second platforms move simultaneously and conjointly with said carriage.

28. The apparatus of claim 14, wherein said workpieces are silicon wafers from which semiconductor devices are made.

29. The method of claim 1, wherein said first transfer arm is movable through said first cassette and said second transfer arm is movable through said second cassette.

30. The apparatus of claim 14, wherein said first platform is horizontally offset relative to said second platform.

* * * * *

UNITED STATES PATENT AND TRADEMARK OFFICE
CERTIFICATE OF CORRECTION

PATENT NO. : 4,685,852

DATED : August 11, 1987

INVENTOR(S) : Rubin, et al.

It is certified that error appears in the above-identified patent and that said Letters Patent is hereby corrected as shown below:

Column 7, line 35, change "unloading" to --unloaded--.

Signed and Sealed this

Fifteenth Day of December, 1987

Attest:

DONALD J. QUIGG

*Attesting Officer*     *Commissioner of Patents and Trademarks*